(12) United States Patent
Xie et al.

(10) Patent No.: US 10,658,243 B2
(45) Date of Patent: May 19, 2020

(54) METHOD FOR FORMING REPLACEMENT METAL GATE AND RELATED STRUCTURES

(71) Applicant: GLOBALFOUNDRIES INC., Grand Cayman (KY)

(72) Inventors: Ruilong Xie, Schenectady, NY (US); Daniel Chanemougame, Niskayuna, NY (US); Steven R. Soss, Cornwall, NY (US); Steven J. Bentley, Menands, NY (US); Chanro Park, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/002,385

(22) Filed: Jun. 7, 2018

(65) Prior Publication Data
US 2019/0378761 A1 Dec. 12, 2019

(51) Int. Cl.
| H01L 21/8234 | (2006.01) |
| H01L 27/088 | (2006.01) |
| H01L 21/311 | (2006.01) |
| H01L 29/66 | (2006.01) |
| H01L 29/51 | (2006.01) |

(52) U.S. Cl.
CPC ........ *H01L 21/823431* (2013.01); *H01L 21/31144* (2013.01); *H01L 21/823462* (2013.01); *H01L 27/0886* (2013.01); *H01L 29/513* (2013.01); *H01L 29/66545* (2013.01)

(58) Field of Classification Search
CPC .............................. H01L 29/66545
See application file for complete search history.

(56) References Cited

U.S. PATENT DOCUMENTS

| 6,873,009 | B2 | 3/2005 | Hisamoto et al. |
| 9,362,355 | B1 | 6/2016 | Cheng et al. |
| 9,530,863 | B1 | 12/2016 | Zhang et al. |
| 9,530,866 | B1 | 12/2016 | Zhang et al. |
| 9,640,636 | B1 | 5/2017 | Bentley et al. |
| 9,704,754 | B1 | 7/2017 | Bao et al. |
| 9,711,618 | B1 * | 7/2017 | Cheng .............. H01L 29/66545 |
| 9,780,208 | B1 | 10/2017 | Xie et al. |

(Continued)

*Primary Examiner* — Yu-Hsi Sun
(74) *Attorney, Agent, or Firm* — Anthony Canale; Hoffman Warnick LLC

(57) ABSTRACT

The present disclosure relates to methods for forming replacement metal gate (RMG) structures and related structures. A method may include: forming a portion of sacrificial material around each fin of a set of adjacent fins; forming a first dielectric region between the portions of sacrificial material; forming a second dielectric region on the first dielectric region; forming an upper source/drain region from an upper portion of each fin; removing only the second dielectric region and the sacrificial material; and forming a work function metal (WFM) in place of the second dielectric region and the sacrificial material. The semiconductor structure may include gate structures surrounding adjacent fins; a first dielectric region between the gate structures; a second dielectric region above the first dielectric region and between the gate structures; and a liner between the first dielectric region and the gate structures such that the second dielectric region directly contacts the gate structures.

16 Claims, 11 Drawing Sheets

(56) References Cited

U.S. PATENT DOCUMENTS

| | | |
|---|---|---|
| 2007/0111435 A1 | 5/2007 | Kim et al. |
| 2009/0159964 A1 | 6/2009 | Lee |
| 2011/0140195 A1 | 6/2011 | Zahurak et al. |
| 2012/0052640 A1 | 3/2012 | Fischer et al. |
| 2018/0019337 A1 | 1/2018 | Xie et al. |

* cited by examiner

METHOD FOR FORMING REPLACEMENT METAL GATE AND RELATED STRUCTURES

BACKGROUND

Technical Field

The present disclosure relates to methods for forming replacement metal gate (RMG) structures for vertical field effect transistors (VFETs) and related integrated circuit (IC) structures.

Related Art

Conventional integrated circuits, such as microprocessors, storage devices, etc., include millions of circuit elements including structures such as transistors. Transistors come in a variety of shapes, orientations, and forms, e.g., planar, fin-type, nanowire, etc. Irrespective of the physical configuration of the transistor device, each transistor comprises source/drain regions in a substrate, and a gate structure defining a channel positioned between the source/drain regions. Transistors may be utilized by applying a predetermined control voltage to the gate structure, causing the portion of the channel in contact with the gate structure and between the source/drain regions to become conductive. The transistors are generally either an N-type (NFET) or P-type (PFET) transistor device wherein the "N" and "P" indicate the type of dopants used to create the source/drain regions of the devices.

As discussed above, transistors come in a variety of shapes, orientations, and forms. One conventional type of transistor includes a two-dimensional field effect transistor (FET), for example, a planar type transistor, in which current flows through the channel region in a substrate between source/drain regions in/on the substrate adjacent to the channel. To provide better control of the current flow, three-dimensional transistor structures or vertical field effect transistors (VFETs) are becoming more commonly used as opposed to conventional two-dimensional transistors. VFETs are electronic switching devices in which the channel described with respect to the planar FET is replaced by a fin structure that extends outward, normal to the substrate surface, and between source/drain regions. Generally, in three-dimensional transistors the gate structure that controls current flow in the fin, wraps around the entire fin so as to influence the current flow from three surfaces instead of one as in planar FETs. As a result, three-dimensional transistors may exhibit faster switching performance and reduced current leakage which may improve overall performance of the transistors.

The fabrication of vertical field effect transistors (VFETs) may include a gate-first approach or a gate-last approach. Specifically, gate-first fabrication refers to the formation of a gate structure around a fin on a semiconductor structure prior to activation of the semiconductor substrate to form the upper source/drain regions. However, since gate-first fabrication includes the formation of the gate structure prior to activation, the temperature requirements of the annealing steps used for the activation may negatively affect the performance of the subsequently formed VFET.

Gate-last fabrication refers to the formation a dummy gate structure around the fin to occupy the gate space during the substrate activation. The dummy gate structure may be removed after the activation, and a replacement metal gate (RMG) formed in its place. Gate-last fabrication may protect the gate structure of the VFET and be preferred over gate-first approaches.

However, there continues to be challenges associated with the gate-last approach. For example, after the RMG has been formed over a pair of fins for the VFETs, a portion of the RMG between the fins is generally removed to allow for an insulator material to be formed and electrically isolate adjacent VFETs. During removal of the portion of the RMG between the fins, the etching process may inadvertently affect other structures such as upper source/drain regions and/or caps on the fins. Additionally, the etching process may remove portions of the RMG desired to remain for the VFETs, negatively affecting the performance of the VFETs.

In some semiconductor structures where pairs of different types of VFETs, e.g., PFETs and NFETs, are desired, different RMG materials may be used for the different VFETs. In instances where gate-last fabrication is utilized to form pairs of adjacent NFETs and PFETs, the process may include the formation of a PFET RMG material over all of the fins, and subsequent removal of the PFET RMG material from just the NFET fins to allow for an NFET RMG material to be formed. During the removal of the PFET RMG, damage may be caused to the portion of the PFET RMG to remain for the PFETs, and may negatively affect the performance of the PFETs.

SUMMARY

A first aspect of the disclosure is directed to a method of forming a replacement metal gate (RMG) structure for an integrated circuit (IC). The method may include: providing an initial structure including a substrate, a first fin formed over the substrate and a second fin formed over the substrate, the first and second fins being laterally separated from one another; forming a first portion of a sacrificial material around the first fin, a second portion of the sacrificial material around the second fin, and a first dielectric region between the first and second portions of the sacrificial material, wherein an upper surface of the first portion of the sacrificial material is positioned below an upper surface of the first fin, an upper surface of the second portion of the sacrificial material is positioned below an upper surface of the second fin, and an upper surface of the first dielectric region is positioned below the upper surface of the first portion of the sacrificial material and below the upper surface of the second portion of the sacrificial material; removing the sacrificial material to expose the first fin, expose the second fin, and expose the first dielectric region; and forming a replacement metal gate structure around the first and second fins, including areas between the first fin and the first dielectric region and between the second fin and the first dielectric region, and on top of the first dielectric region.

A second aspect of the disclosure is directed to an integrated circuit (IC) structure. The structure may include: a substrate; a first fin and a second fin, the first and second fins being positioned over the substrate and laterally separated from one another; a replacement metal gate structure including a first gate structure surrounding sidewalls of the first fin and a second gate structure surrounding sidewalls of the second fin; and a first dielectric region positioned above the substrate and separating a lower portion of the first gate structure from a lower portion of the adjacent second gate structure, wherein an upper surface of the first dielectric region is positioned below an upper surface of the first gate structure and below an upper surface of the second gate structure, and wherein the replacement metal gate structure further includes a portion positioned on top of the first dielectric region.

A third aspect of the disclosure is directed to another integrated circuit (IC) structure. The structure may include: a substrate; a first fin, a second fin and a third fin, the first, second and third fins being positioned over the substrate such that the first fin is laterally separated from the second fin and the third fin is laterally separated from the second fin; a replacement metal gate structure including a first gate structure surrounding sidewalls of the first fin, a second gate structure surrounding sidewalls of the second fin and a third gate structure surrounding sidewalls of the third fin; and a first dielectric region positioned above the substrate and separating a lower portion of the first gate structure from a lower portion of the adjacent second gate structure, wherein an upper surface of the first dielectric region is positioned below an upper surface of the first gate structure, below an upper surface of the second gate structure and below an upper surface of the third gate structure, and wherein the replacement metal gate structure further includes a portion positioned on top of the first dielectric region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein:

FIG. 10 shows removing the dummy gate structures from the perspective of line A-A of FIG. 7. FIG. 11 shows removing the dummy gate structures from the perspective of line B-B of FIG. 7.

FIG. 12 shows forming the first Gate metal from the perspective of line A-A of FIG. 7. FIG. 13 shows forming the first Gate metal from the perspective of line B-B of FIG. 7.

FIG. 14 shows forming the mask from the perspective of line A-A of FIG. 7. FIG. 15 shows forming the mask from the perspective of line B-B of FIG. 7.

FIG. 17 shows forming the second Gate metal over the PFET region from the perspective of line B-B of FIG. 7. FIG. 18 shows forming the second Gate metal around the fins in the NFET region from the perspective of line A-A of FIG. 7.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

The present disclosure relates to methods for forming replacement metal gates (RMGs) for vertical field effect transistors (VFETs), and the resulting semiconductor structures. Specifically, the present disclosure provides methods for forming RMGs that mitigate damage to the RMGs and other components of the VFETs during subsequent processing of the VFETs. More specifically, the methods described herein include forming a sacrificial material, i.e. dummy gate structure, around each fin of a set of fins; forming a first dielectric region between the dummy gate structures on the fins; and forming a second dielectric region above the first dielectric region. The second dielectric region may be subsequently removed and replaced by an RMG while the first dielectric region remains intact. In contrast to conventional replacement of both the first and second dielectric regions with an RMG, the replacement of only the second dielectric region may reduce the amount of the RMG that must be subsequently removed. Reducing the amount of RMG to be removed reduces the length of an etching process required to remove the structure and reduces the duration of exposure of other semiconductor structures to the etchant. The method for forming RMGs discussed herein mitigates and/or prevents damage conventionally caused to VFET structures during the partial RMG removal step. As will also be discussed herein, the second dielectric region may also act as an etch stop structure, mitigating and/or preventing damage to another portion of the RMG during other processing steps.

Figure 1:
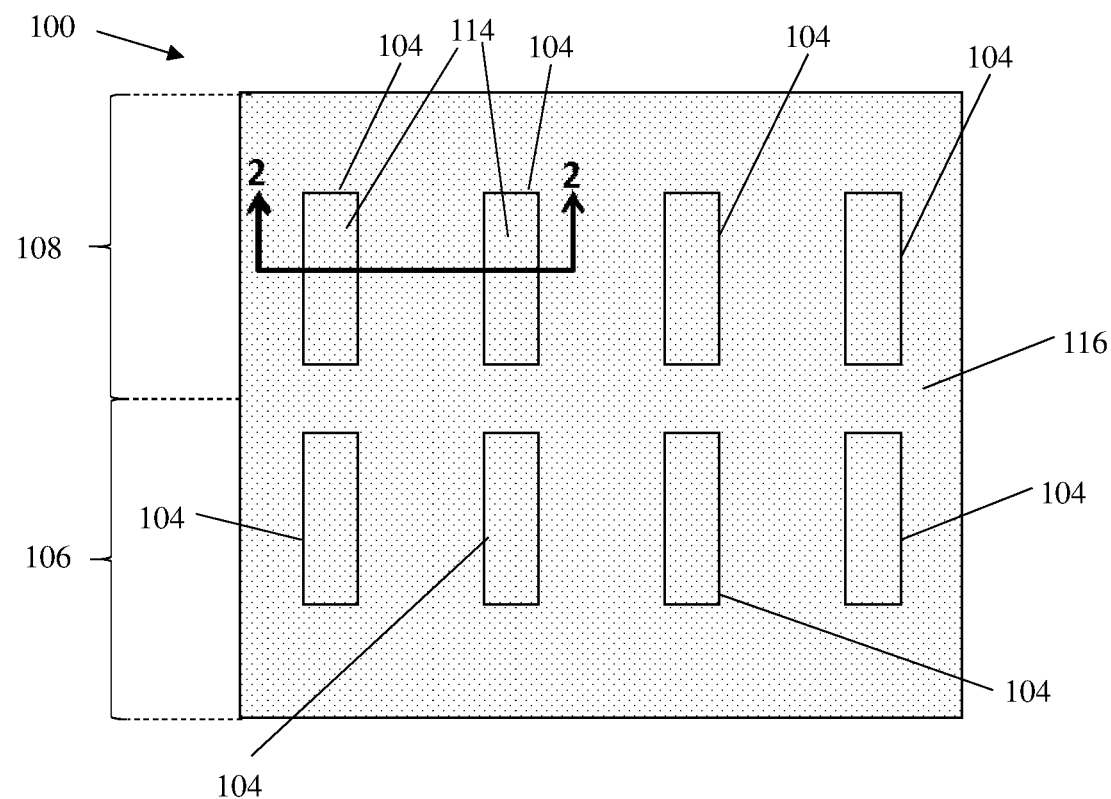
FIG. 1 shows a top-down view of an initial structure, according to embodiments of the disclosure.
Figure 2:
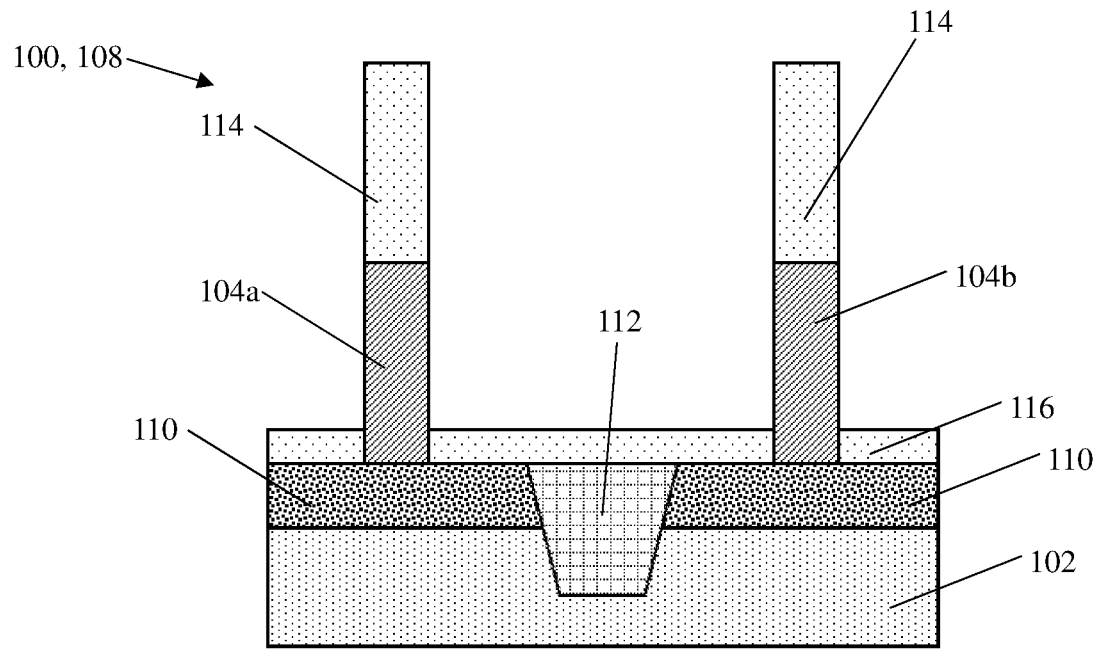
FIG. 2 shows a cross-sectional view of the initial structure at line 2-2 of FIG. 1.

Referring first to FIGS. 1 and 2 together, an initial structure 100 is shown, according to embodiments of the disclosure. FIG. 1 provides a top-down view of the initial structure, and FIG. 2 provides a cross-sectional view of the initial structure in PFET region 108 at line 2-2 of FIG. 1. Initial structure 100 may include a substrate 102 (FIG. 2 only). Substrate 102 may include any currently-known or later developed material capable of being processed into a transistor structure, and may include, e.g., a bulk semiconductor layer, a semiconductor-on-insulator (SOI) substrate, etc. Substrate 102 thus may overlie one or more other layers of material having distinct material and/or electrical properties, with such layers of material being omitted from the accompanying FIGS. to better illustrate structures and processes to form an IC structure according to the disclosure. Substrate 102 may include any currently known or later developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 102 or a portion thereof may be strained. Substrate 102 of initial structure 100 may be formed by forming a semiconductor material on an underlying structure (not shown). According to an example, substrate 102 can be formed by deposition and/or wafer bonding, e.g., separation by implantation of oxygen (SIMOX).

As shown in FIGS. 1 and 2, initial structure 100 may also include a plurality of spaced fins 104 over substrate 102 (FIG. 2 only) including a hard mask layer 114 thereon. As will be discussed later herein, fins 104 may be subsequently utilized as a channel of vertical field effect transistors (VFETs) for a semiconductor device. Initial structure 100 may include fins for different types of VFETs, for example, PFETs and NFETs. The "N" and "P" indicate the type of dopants used to create the source/drain regions of the devices. For example, as shown in the top down view of FIG. 1, fins 104 may be formed in an NFET region 106 for subsequently formed N-type VFETs (NFETs), or in a PFET region 108 for subsequently formed P-type VFETs (PFETs). Fins 104 may be formed from substrate 102 by any suitable process including one or more photolithography and etch processes. For example, hard mask layer 114 may be patterned on substrate 102 by deposition and etching. Hard mask layer 114 may protect and cover portions of substrate 102 during a subsequent etching process to form fins 104. As shown in FIGS. 1 and 2, hard mask layer 114 may remain on the upper surface of fins 104 to protect the fins during additional processing. For example, hard mask layer 114 may protect fins 104 from exposure to an etchant during the removal of other materials subsequently formed on the initial structure. Fins 104 may include semiconductor materials, including but not limited to silicon, silicon germanium, and any III-V type material. Hard mask layer 114 may include silicon nitride (SiN) and/or any other now known or later developed material for a cap and/or spacer material. While eight fins are shown in the top-down view of FIG. 1, it is to be understood that any number of fins may be employed without departing from aspects of the disclosure.

As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

Referring to FIG. 2, initial structure 100 may also include lower source/drain regions 110 formed within substrate 102. Each lower source/drain region 110 may be positioned below a respective fin 104. Lower source/drain regions 110 may be formed by conventional semiconductor fabrication techniques for forming a source/drain region for a VFET. The lower source/drain regions may be formed as either N-type source/drain regions or P-type source/drain regions. For example, lower source/drain regions 110 shown in PFET region 108 of FIG. 2 may include P-type source/drain regions for PFETs. Although P-type lower source/drain regions 110 are shown in FIG. 2, it should be understood that N-type lower source/drain regions may be formed within substrate 102 into and out of the plane of FIG. 2, i.e., in NFET region 106 (FIG. 1) for NFETs.

Formation of P-type source/drain regions 110 may include in-situ P-type doping. For example, a P-type dopant is introduced to the substrate 102 to generate free hole (by "accepting" electron from semiconductor atom and "releasing" hole at the same time). The P-type dopants may include without limitation boron (B), indium (In), and gallium (Ga). P-type lower source/drain regions 110 may include silicon germanium and/or any other now known or later developed stressor for generating compressive stress in the channel of the subsequently formed PFET to enhance the mobility of the holes created by the P-type dopant.

Although not shown, N-type lower source/drain regions formed in NFET region 106 of FIG. 1 may be formed by similar methods as discussed above with respect to P-type source/drain regions 110, with the exception of source/drain region material, and the dopant used to dope the region. For example, N-type source/drain regions may be formed in substrate 102 by in-situ N-type doping. The N-type dopants may include but are not limited to, for example, phosphorous (P), arsenic (As), antimony (Sb), etc. N-type source/drain regions may include, for example, silicon phosphorus (SiP), and/or any other now known or later developed material for forming an N-type source/drain region.

As shown in the cross-sectional view of FIG. 2, initial structure 100 may also include an isolation region, e.g., shallow trench isolation (STI) 112, disposed between adjacent lower source/drain regions 110 in substrate 102. STI 112 may physically and/or electrically isolate the source/drain regions from one another. STI 112 may be formed by any suitable process including etching a trench (not shown) within substrate 102 (FIG. 2), and filling the trench with insulating material, e.g., by deposition. The insulating material of STI 112 may include but is not limited to silicon oxide ($SiO_2$).

As used herein, the term "depositing" may include any now known or later developed technique appropriate for deposition, including but not limited to, for example: chemical vapor deposition (CVD), low-pressure CVD (LPCVD), plasma-enhanced CVD (PECVD), semi-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation.

As shown in FIGS. 1 and 2, initial structure 100 may also include a bottom spacer 116 above substrate 102 (FIG. 2) adjacent to fins 104. Bottom spacer 116 may protect covered portions of lower source/drain regions 110 and/or substrate 102 from damage during subsequent processing of initial structure 100. For example, bottom spacer 116 may protect the structures from exposure to an etchant during the removal of other materials subsequently formed on the initial structure. Bottom spacer 116 may also electrically isolate lower source/drain regions 110 from other nearby structures to prevent electrical leakage. Bottom spacer 116 may include silicon nitride (SiN) and/or any other now known or later developed material for a cap and/or spacer material. Bottom spacer 116 may be formed by deposition and etching techniques. Bottom spacer 116 may be formed, for example, after lower source/drain regions 110, and STI 112 by deposition of spacer material over source/drain regions 110, STI 112 and/or substrate 102, and etching to form bottom spacer 116.

Figure 3:
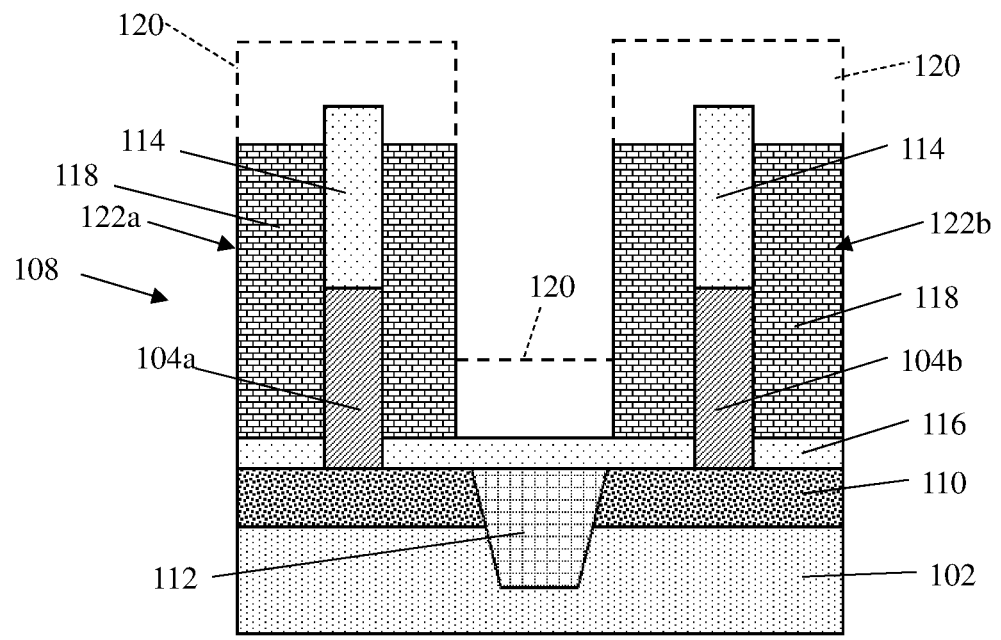
FIG. 3 shows forming dummy gate structures around the fins of the initial structure of FIG. 2, according to embodiments of the disclosure.

Turning next to FIG. 3, dummy gate structures 122a,b may be formed around fins 104a,b of initial structure 100 of FIG. 2. Although shown in FIG. 3 with respect to fins 104a,b in PFET region 108, it is understood that dummy gate structures 122a,b may also be formed substantially simultaneously on each fin 104 of initial structure 100 (FIGS. 1 and 2). Dummy gate structures 122a,b may protect fins 104a,b during subsequent processing steps and may act as a place holder for a replacement metal gate (RMG). Dummy gate structures 122a,b may be formed by any suitable process such as deposition and etching. For example, dummy gate structures 122a,b may be formed by conformally depositing sacrificial material 118 on initial structure 100 (FIGS. 1 and 2), including fins 104a,b, hardmask layer 114, and spacer 116. Portions 120 (in phantom) of sacrificial material 118 on hard mask layer 114 and on spacer 116 above STI 112 may then be removed to form dummy gate structures 122a,b (sometimes also referred to herein as first extended portion and second extended portion of sacrificial material, respectively). Although not shown in the cross-section of FIG. 3, fins 104a,b may extend into and out of the plane of the page, and dummy gate structures 122a,b may also extend into and out of the plane of the page to substantially surround the fins. Sacrificial material 118 may include any suitable material for dummy gate structures such as, for example, a thin layer of $SiO_2$ followed by amorphous silicon. Portions 120 and portions (not labeled) of sacrificial material 118 over fins 104 and hard mask layer 114 may be removed by anisotropic etching.

Figure 4:
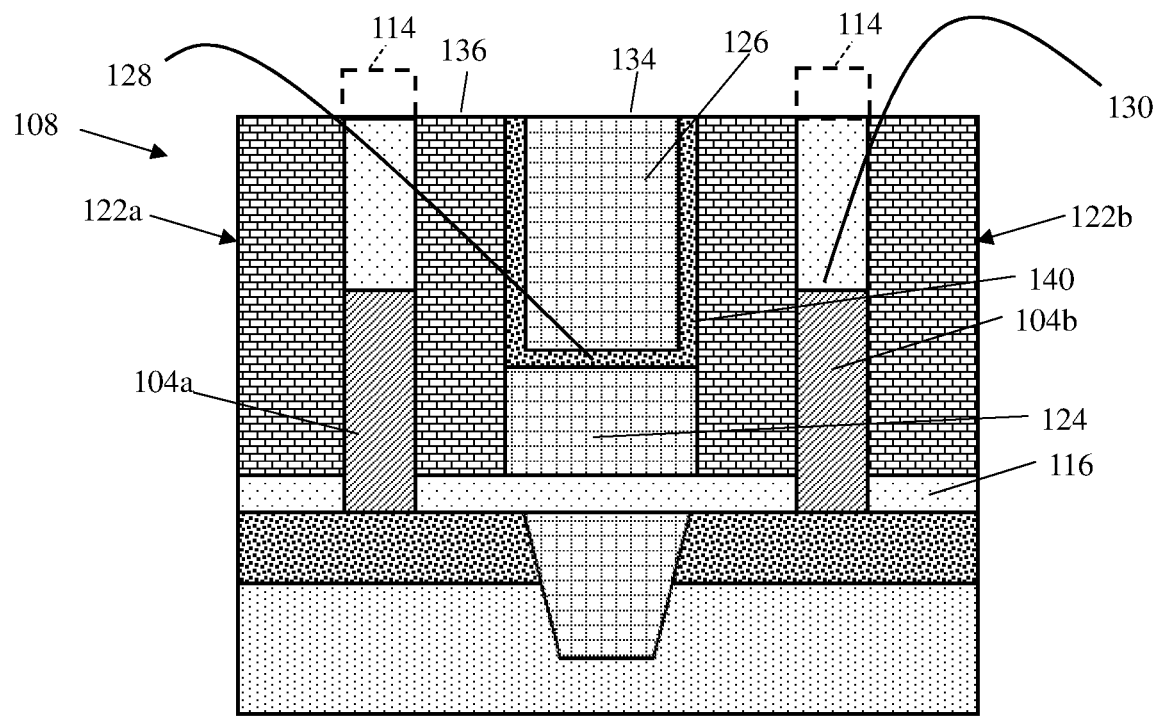
FIG. 4 shows forming a first and second dielectric region between the dummy gate structures of FIG. 3, according to embodiments of the disclosure.

Turning next to FIG. 4, in contrast to conventional VFET fabrication processes, embodiments of the disclosure may include forming a first dielectric region 124 and a second dielectric region 126 between dummy gate structures 122a, b. For example, first dielectric region 124 may be formed on spacer 116 above STI 112, an optional liner 140 may be formed after first dielectric region 124, and second dielectric region 126 may be formed above first dielectric region 124 and/or liner 140. As will be discussed in further detail later herein, forming two, stacked dielectric regions instead of a single dielectric region may protect subsequently formed Gate metals during additional processing. As will also be discussed later herein, forming two, stacked dielectric regions may reduce the duration of a subsequent etching process by requiring only the second dielectric region to be removed, and may reduce damage to surrounding components conventionally caused by the longer duration etch.

First and second dielectric region 124 and 126 may each be formed by any suitable process such as deposition and etching. For example, first dielectric region 124 may be deposited over the structure of FIG. 3 and etched back such that an upper surface 128 of first dielectric region 124 above STI 112 is positioned below an upper surface 130 of fins 104a,b. Second dielectric region 126 may be deposited over first dielectric region 126 and planarized such that an upper surface 134 of the second dielectric region is substantially co-planar with an upper surface 136 of dummy gate structures 122a,b. As shown in FIG. 4, portions of hard mask 114 shown in phantom may also be removed during the planarization of second dielectric region 126. First dielectric region 124 and second dielectric region 126 may include silicon oxide ($SiO_2$), silico oxygen carbon nitride (SiOCN), silicon carbon boron nitride (SiBCN), and/or any other desirable dielectric material. First dielectric region 124 may include the same or different material than second dielectric region 126.

As also shown in FIG. 4, liner 140 may be optionally formed between first and second dielectric regions 124,126. For example, after first dielectric region 124 is formed, liner 140 may be formed on upper surface 128 of the first dielectric region, and on sidewalls of dummy gate structures 122a,b. Second dielectric region 126 may then be formed on liner 140. Optional liner 140 may be formed by any suitable process such as conformal deposition and etching. Material for liner 140 may include, silicon nitride (SiN), hafnium oxide (HfO2), aluminum oxide (Al2O3), silicon oxycarbon nitride (SiOCN), silicon carbide (SiC), or silicon oxycarbon (SiCO), etc, and may be different than the material of first dielectric region 124.

Figure 5:
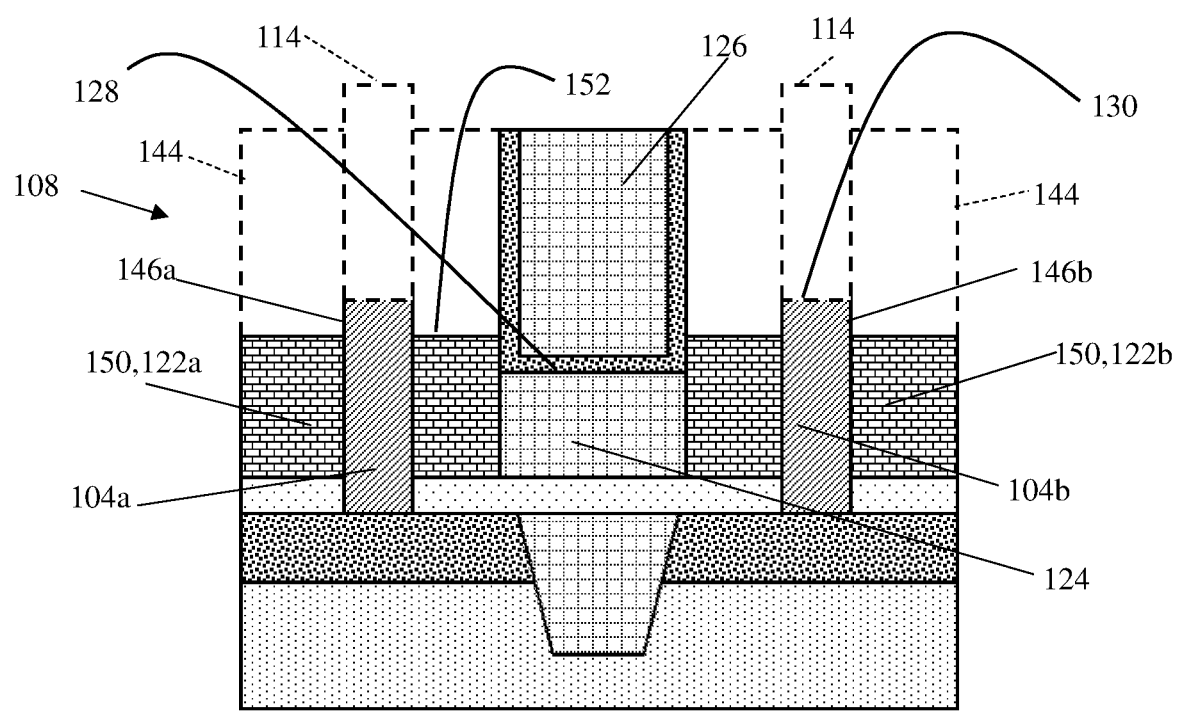
FIG. 5 shows removing a portion of the dummy gate structure and exposing an upper portion of the fins of FIG. 4, according to embodiments of the disclosure.

Turning next to FIG. 5, cap 114 (in phantom) and a portion 144 (in phantom) of dummy gate structures 122a,b may be removed to expose upper portions 146a,b of fins 104a,b, respectively. As will be discussed later herein with respect to FIG. 6, exposing upper portions 146a,b of fins 104a,b may allow for upper source/drain regions 156 (FIG. 6) for a VFET structure to be formed therefrom. Cap 114 (in phantom) and portions 144 (in phantom) of dummy gate structures 122a,b may be removed by any suitable process such as selective etching. As used herein, selective etching may include an etching process that allows a predetermined material to be removed without affecting other materials of the IC structure. As also shown in FIG. 5, first and second dielectric regions 124,126 and portions 150 of dummy gate structures 122a,b may remain intact after removing cap 114 and portions 144. Portions 150 of dummy gate structures 122a,b may sometimes be referred to herein as the first portion of the sacrificial material around the first fin and the second portion of the sacrificial material around the second fin, respectively. The duration of the etching process may be controlled to allow for only portions 144 (in phantom) of dummy gate structures 122a,b to be removed and leave remaining portions 150. It is noted here that portions 150 of dummy gate structures 122a,b have an upper surface 152 below upper surface 130 of fins 104a,b, and that upper surface 128 of first dielectric region 124 is below upper surface 152 of portions 150 of dummy gate structures 122a,b.

Figure 6:
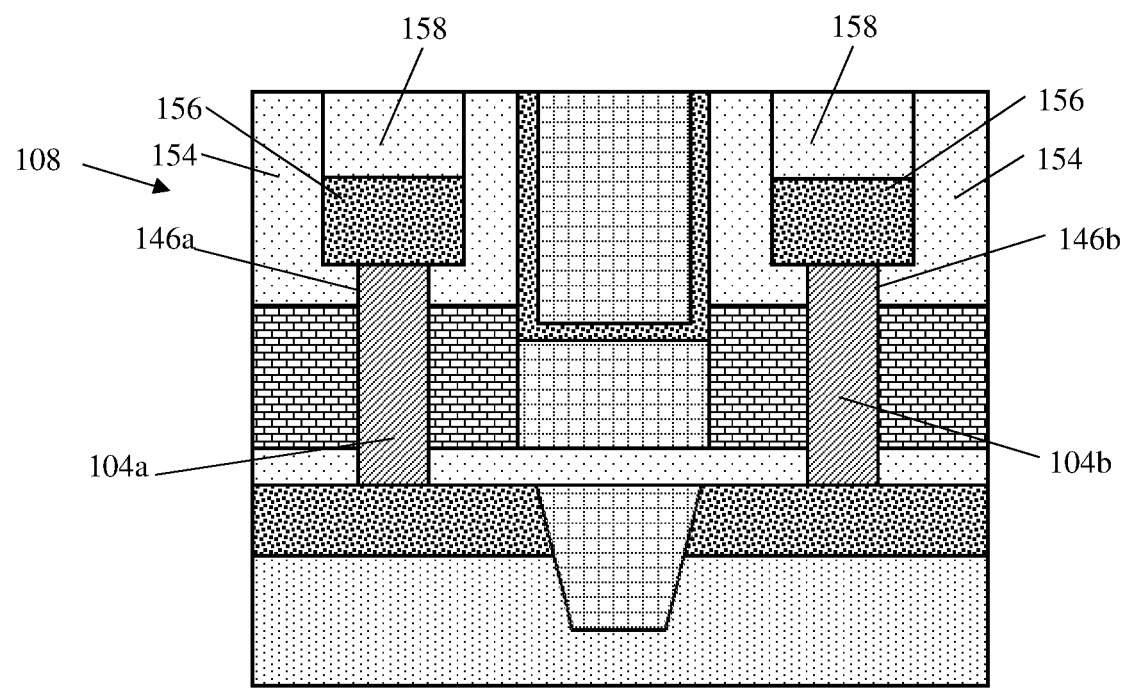
FIG. 6 shows forming an upper source/drain region, spacers and a cap on the exposed upper surface of the fins of FIG. 5, according to embodiments of the disclosure.

Turning next to FIG. 6, inner spacers 154, upper source/drain region 156, and a cap 158 for a VFET may be formed on each exposed upper portion 146a,b (FIG. 5) of the fins. Inner spacers 154 may be formed around each exposed upper portion 146a,b (FIG. 5) before forming upper source/drain regions 156. Inner spacers 154 may be formed to isolate subsequently formed upper source/drain regions 156 from other semiconductor structures and to protect the source/drain regions from damage during subsequent processing. Inner spacers 154 may include silicon nitride (SiN), and/or any other suitable material to protect upper source/drain region 156. Inner spacers 154, may be formed by any suitable semiconductor fabrication process. For example, inner spacers 154 may be formed by atomic layer deposition (ALD) and anisotropic etching.

Upper source/drain regions 156 may be formed on exposed upper portions 146a,b (FIG. 5) of the fins after inner spacers 154 are formed. Upper source/drain regions 156 may allow fins 104a,b to become channels for VFETs subsequently formed therefrom. Upper source/drain regions 156 may be formed by any suitable semiconductor fabrication process. For example, a portion (not shown) of inner spacers 154 may be removed, and upper source/drain region 156 may be formed by epitaxial growth from exposed upper portions 146a,b of fins 104a,b. Upper source/drain region 156 shown in FIG. 6 in PFET region 108 may include P-type source/drain regions for PFETs. For example, upper source/drain regions 156 in PFET region 108 may include silicon germanium (SiGe), and/or any other suitable stressor for generating compressive stress in the channel of a subsequently formed PFET to enhance the mobility of the holes created by any suitable P-type dopant. Although not shown, N-type upper source/drain regions 156 may be formed on fins 104 in NFET region 106 (FIG. 1), and may include, for example, silicon phosphorous (SiP) and/or any other suitable material for forming a source/drain region of an NFET.

Cap 158 may be formed on upper source/drain regions 156 to isolate the source/drain regions from other semiconductor structures and to protect the source/drain regions from damage during subsequent processing. Cap 158 may be formed by any suitable semiconductor fabrication process. Cap 158 may be formed over upper source/drain regions 156 by deposition and planarization. Cap 158 may include silicon nitride (SiN), and/or any other suitable material to protect upper source/drain region 156. Cap 158 may include the same or different materials as inner spacers 154. Although the cross-section of FIG. 6 shows fins 104a,b in PFET region 108, it is understood that inner spacers 154, upper source/drain region 156 and cap 158 may be formed on each fin 104 of initial structure 100 (FIG. 1).

The terms "epitaxial growth and/or deposition" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth and/or deposition processes may be selective to forming on semiconductor surfaces, and may not deposit material on dielectric surfaces, such as silicon dioxide or silicon nitride surfaces.

Figure 7:
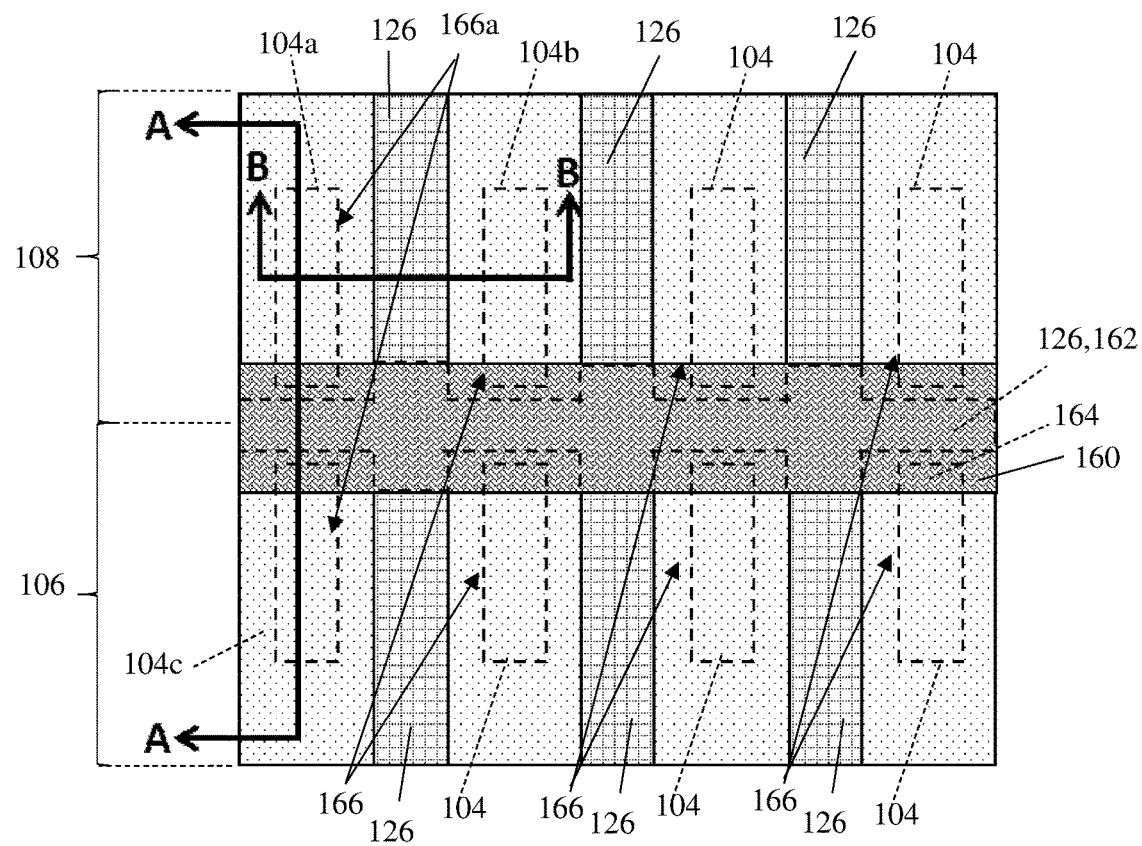
FIG. 7 shows a top-down view of forming a mask between a PFET region and NFET region of the structure of FIG. 6, according to embodiments of the disclosure.
Figure 8:
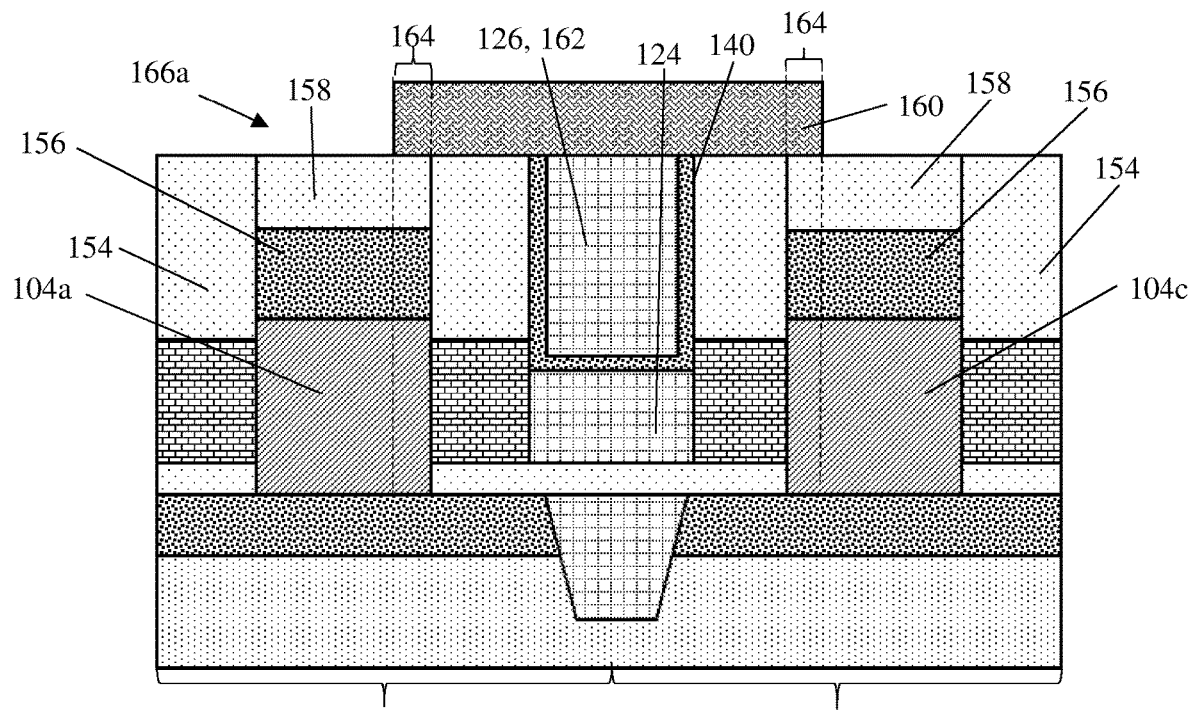
FIG. 8 shows a cross-sectional view of forming the mask at line A-A of FIG. 7, according to embodiments of the disclosure.
Figure 9:
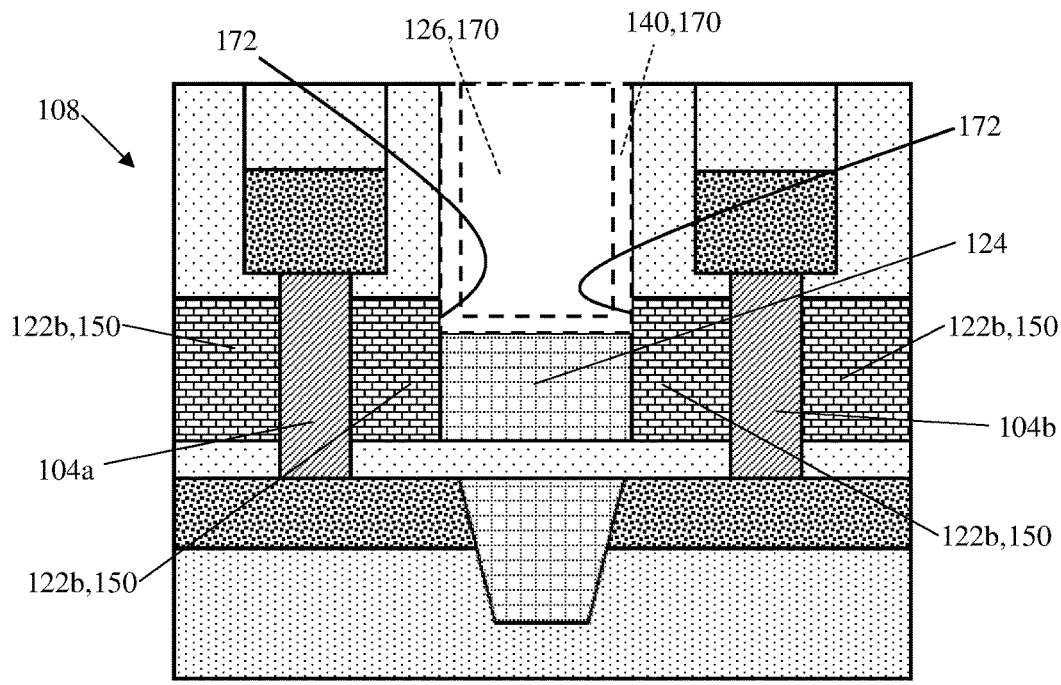
FIG. 9 shows a cross-sectional view of removing a portion of the second dielectric region not covered by the mask of FIGS. 7 and 8, from the perspective of line B-B of FIG. 7, according to embodiments of the disclosure.

Turning next to FIGS. 7 and 8 together, a mask 160 may be formed over a portion 162 of second dielectric region 126 and above portions 164 of fins 104 to protect the structures from being removed during a subsequent etching process discussed herein with respect to FIG. 9. FIG. 7 provides a top view of forming mask 160 over the structure of FIG. 6, and FIG. 8 provides a cross-sectional view of forming mask 160 from the perspective of line A-A of FIG. 7. It should be understood that some portions of the structure depicted in FIG. 6 may have been removed or may be shown in phantom in the top view of FIG. 7 for purposes of simplicity and clarity. As shown in the top-down view of FIG. 7, mask 160 may be formed between multiple pairs 166 of fins 104 between NFET region 106 and PFET region 108. As discussed above, mask 160 may be formed over portion 162 of second dielectric region 126. For example, as best shown in FIG. 8, mask 160 may extend between and over portions 164 of a set of fins 166a. Mask 160 may be formed by any suitable process such as one or more deposition and photolithography steps. Mask 160 may include an organic planarization layer (OPL) and/or any other desirable mask material.

Turning now to FIG. 9, which provides a cross-sectional view of the structure of FIG. 7 from the perspective of line B-B, portions 170 (in phantom) of second dielectric layer 126 and/or optional liner 140 not covered by mask 160 (FIGS. 7 and 8) may be removed to expose a surface 172 of remaining dummy gate structures 122a,b. Portions 170 of second dielectric region 126 and/or optional liner 140 may be removed by any suitable process such as reactive ion etching (RIE). As also shown in the cross-sectional view of FIG. 9, in contrast to conventional VFET fabrication processes, after removing portions 170 of second dielectric region 126 and/or liner 140 (in phantom), first dielectric region 124 may remain intact between set of fins 104a,b in PFET region 108. Although not shown, first dielectric region 124 may also remain intact between other fins in PFET region 108 (see FIG. 7), and between each fin in NFET region 106 (FIG. 7). As will be discussed in greater detail later herein, allowing first dielectric region 124 to remain between fins may mitigate and/or prevent damage to other structures conventionally caused during subsequent processing. Although not shown in the cross-section of FIG. 9, portions 162 (FIG. 8) of second dielectric region 126 covered by mask 160 between pairs 166 of fins 104 across PFET region 108 and NFET region 106 (FIG. 7) may also remain intact after removing portions 170 (in phantom) of second dielectric region 126.

Figure 10:
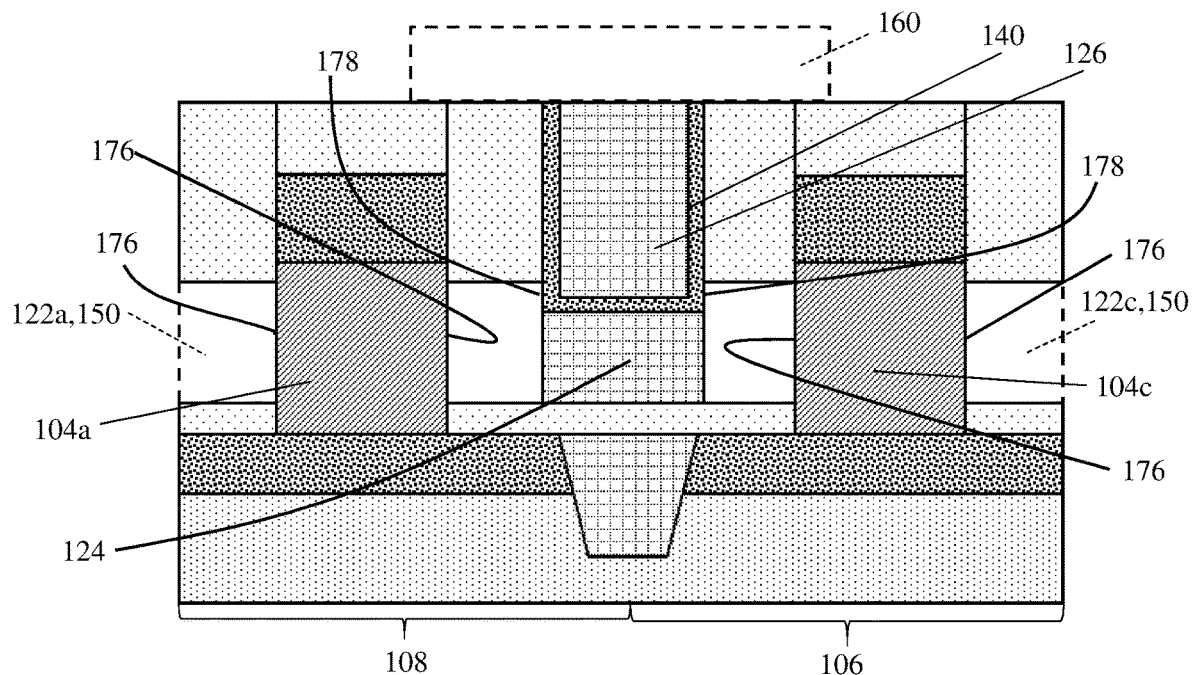
FIGS. 10 and 11 show removing the dummy gate structures around the fins, according to embodiments of the disclosure.

FIG. 10 shows removing mask 160 (in phantom) after removing portions 170 (in phantom, FIG. 9). Mask 160 (in phantom) may be removed by any suitable process such as, for example, stripping.

Figure 11:
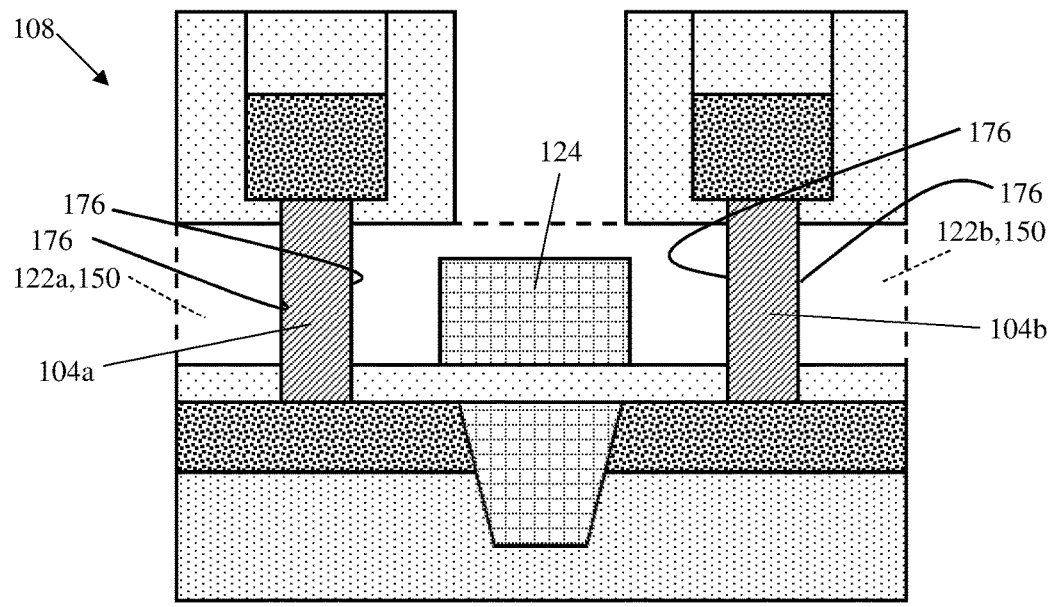

Turning to FIGS. 10 and 11 together, exposed, remaining portions 150 of dummy gate structures 122a,b,c (in phantom) may be removed to allow for replacement metal gate structures to be formed around fins 104a,b,c to form VFETs. FIG. 10 provides a cross-sectional view of removing remaining portions 150 of dummy gate structures 122a,c (in phantom) from the perspective of line A-A of FIG. 7; and FIG. 11 provides a cross-sectional view of removing remaining portions 150 of dummy gate structures 122a,b (in phantom) from the perspective of line B-B of FIG. 7. Although not shown, it is understood that remaining portions 150 of dummy gate structures 122 around other fins of initial structure 100 (FIG. 1) into and out of the page of FIGS. 10 and 11 may also be removed.

Remaining portions 150 of dummy gate structures 122a, b,c (in phantom) may be removed by any suitable process such as selective etching. As shown in FIGS. 10 and 11, after removing remaining portions 150 of dummy gate structures 122a,b,c (in phantom), portions 176 of fins 104a,b,c, and first dielectric region 124 may be exposed. As shown in FIG. 10, a portion 178 of remaining second dielectric region 126 and/or liner 140 may also be exposed after removing portions 150 of dummy gate structures 122a,b,c (in phantom).

Figure 12:
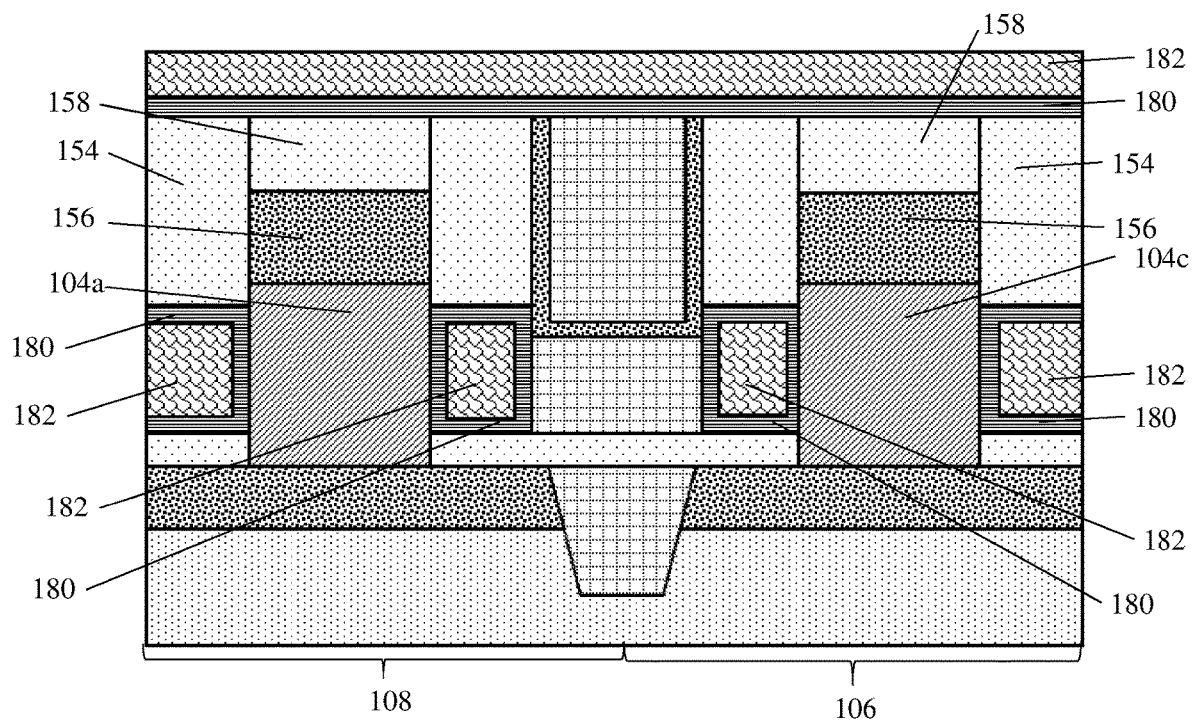
FIGS. 12 and 13 show forming a first replacement metal gate (RMG) structure around the fins, according to embodiments of the disclosure.
Figure 13:
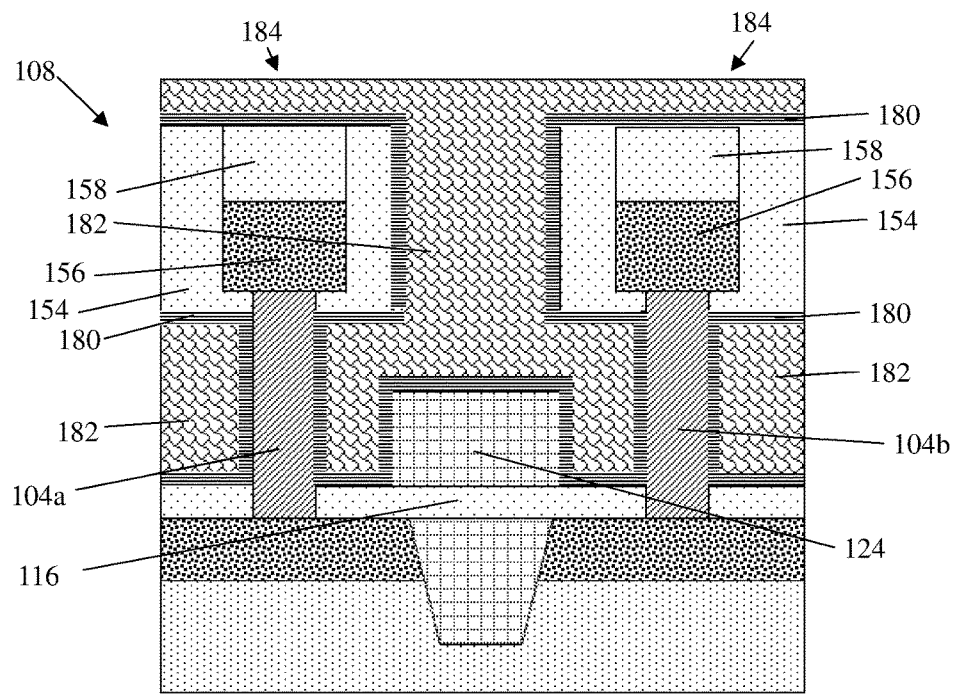

Turning next to FIGS. 12 and 13 together, a gate dielectric 180 and a first work function metal (WFM) 182 may be formed around fins 104a,b,c to form VFETs. FIG. 12 provides a cross-sectional view of forming gate dielectric 180 and first gate metal 182 around fins 104a,c from the perspective of line A-A of the top-down view of FIG. 7. FIG. 13 provides a cross-sectional view of forming gate dielectric 180 and first Gate metal 182 around fins 104a,b from the perspective of line B-B of the top view of FIG. 7.

Gate dielectric 180 may be formed around exposed portions 176 (FIGS. 10 and 11) of fins 104a,b,c; portions of spacers 154; cap 158; spacer 116; first dielectric region 124; and second dielectric region 126 (FIG. 12 only). Gate dielectric 180 may include silicon oxide ($SiO_2$), silicon oxynitride (SiON), or high-k dielectric such as hafnium oxide ($HfO_2$), zirconium oxide ($ZrO_2$), hafnium aluminum oxide ($HfAlO_x$), hafnium zirconium oxide ($HfZrO_x$), hafnium lanthanum oxide ($HfLaO_x$), etc. The high K dielectric material may include a material having a k-value greater than 3.9. For example the high K dielectric material may include metal oxides such as tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity).

As discussed above, in contrast to conventional VFET structures, first dielectric region 124 may remain intact between sets of fins 104 after the removal of portion 170 of second dielectric region 126 (FIG. 9). For example, as shown in FIG. 13, first dielectric region 124 may remain between set of fins 104a,b in PFET region 108. As also shown in FIG. 13, in contrast to conventional gate dielectric formation, since first dielectric region 124 remains intact, gate dielectric 180 may be formed over the first dielectric region.

As also shown in the cross-sectional views of FIGS. 12 and 13, after gate dielectric 180 has been formed, a first work function metal (WFM) 182 for a first replacement metal gate (RMG) may be formed over gate dielectric 180 around each fin 104a,b,c for forming PFETs in PFET region 108. Although shown only with respect to fins 104a,b,c, it is understood that first WFM 182 may be formed each fin 104 in NFET region 106 and PFET region 108 into and out of the plane of FIGS. 12 and 13. As shown in FIG. 13, first WFM 182 may also extend between sets of adjacent fins 104a,b in in the PFET region 108. Although not shown in the cross-section of FIG. 13, it is understood that first WFM 182 may also be formed between adjacent fins 104 in NFET region 106 (FIG. 13). Additionally, in contrast to conventional RMG formation, first WFM 182 may be positioned above first dielectric region 124 instead of directly above spacer 116. First WFM 182 may include a gate work function metal (WFM) for a first type of VFET structure. In the example of FIG. 13, first WFM 182 may include a PFET WFM. Where WFM 182 is a PFET WFM, the WFM may include, for example, titanium nitride (TiN), tantalum nitride (TaN), titanium carbide (TiC), titanium aluminide (TiAl), and/or any other suitable metal or alloy. for forming PFETs 184a,b (FIG. 19) from fins 104a,b, respectively, in PFET region 108. First WFM 182 may be formed by any suitable process such as atomic layer deposition (ALD).

Figure 14:
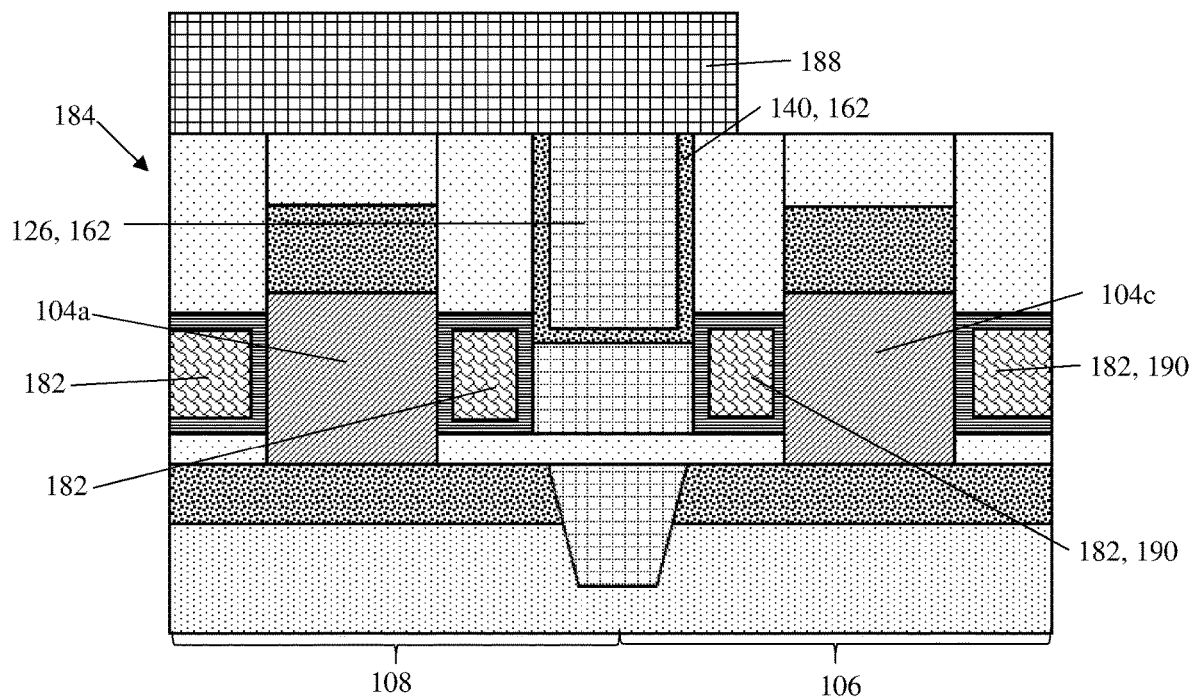
FIGS. 14 and 15 show forming a mask over the first Gate metal and fins in the PFET region, according to embodiments of the disclosure.
Figure 15:
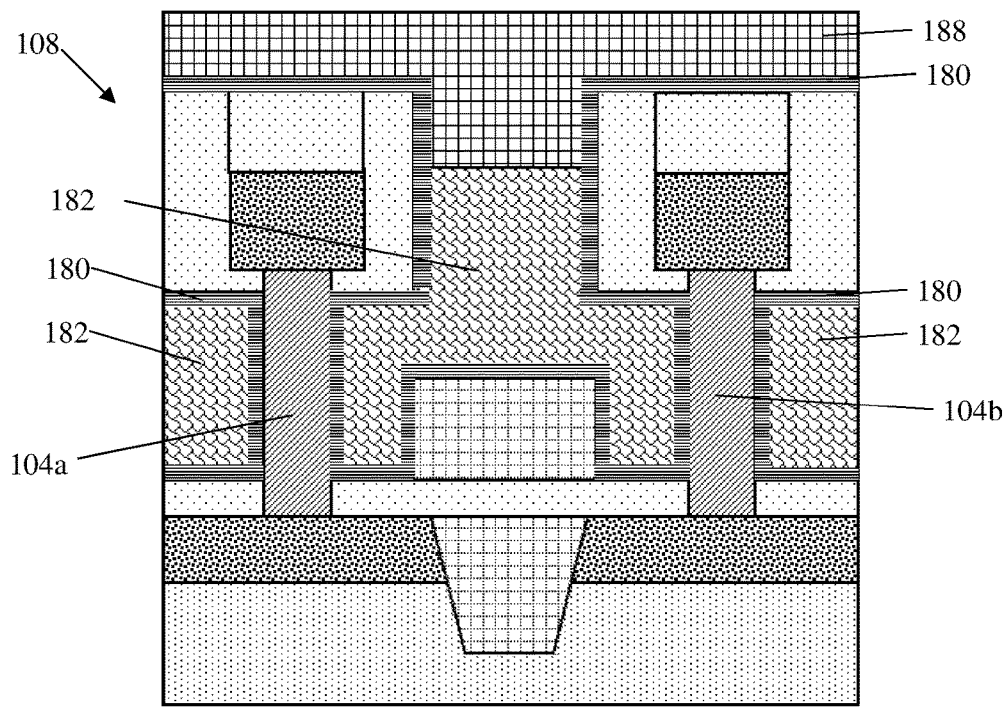

Turning next to FIGS. 14 and 15, after forming first WFM 182, an etch process can be performed to recess the WFM and a mask 188 may be subsequently formed over fins 104a,b in PFET region 108. Mask 188 may be formed to protect structures in PFET region 108 including first WFM 182 during removal of a portion 190 of the first WFM from NFET region 106 (FIG. 14 only). FIG. 14 shows a cross-sectional view of forming mask 188 from the perspective of line A-A of FIG. 7; and FIG. 15 shows a cross-sectional view of forming mask 188 from the perspective of line B-B of FIG. 7. As shown in the cross-sectional view of FIG. 14, mask 188 may be formed to extend over fin 104a in PFET region 108 as well as remaining portion 162 of second dielectric region 126 and/or liner 140 between NFET region 106 and PFET region 108. As also shown in FIG. 14, portion 190 of first gate metal may remain free from mask 188 in NFET region 106. Mask 188 may be formed by any suitable process such as patterned deposition using another mask (not shown). Mask 188 may include an organic planarization layer (OPL) and/or any other desirable mask material.

Figure 16:
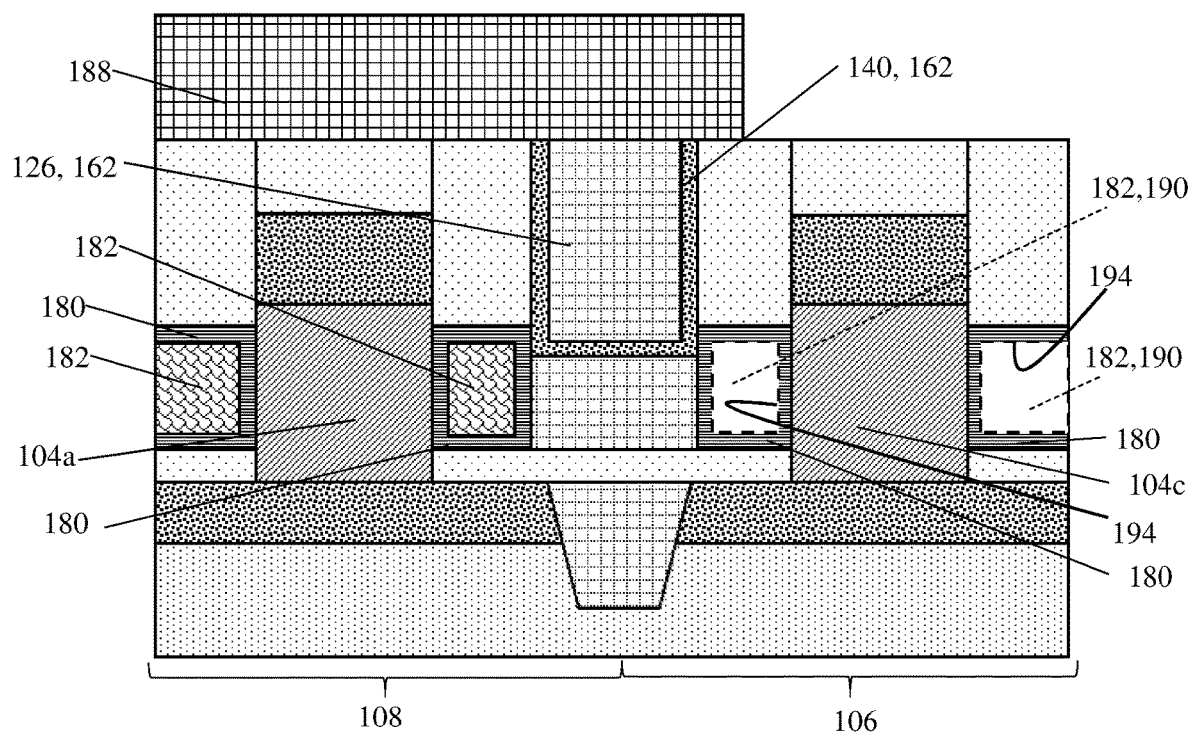
FIG. 16 shows removing the first Gate metal from around fins in the NFET region from the perspective of line A-A of FIG. 7, according to embodiments of the disclosure.
Figure 17:
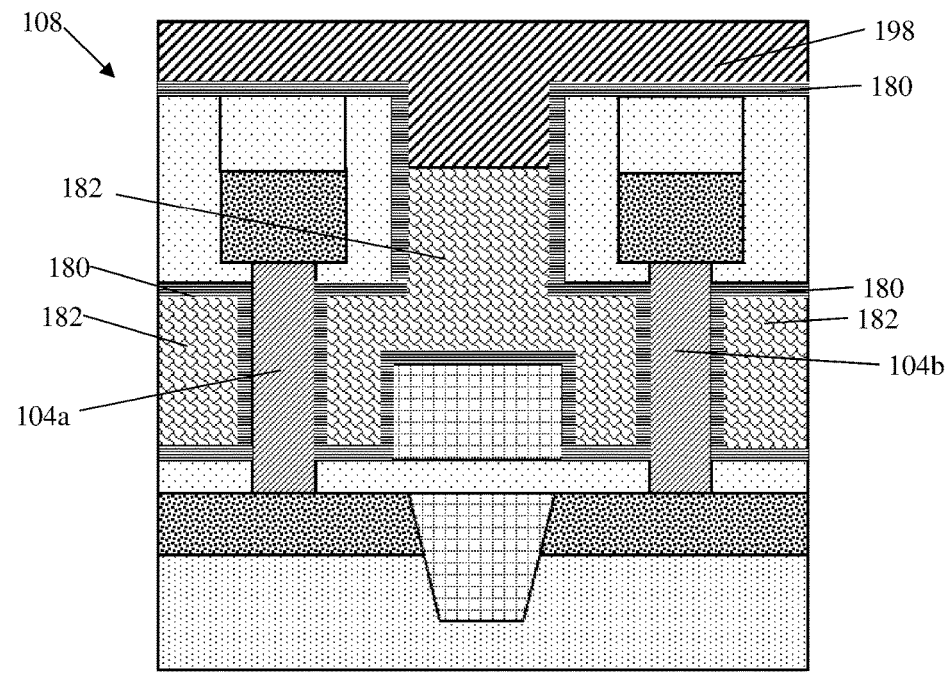
FIGS. 17 and 18 show forming a second Gate metal, according to embodiments of the disclosure.

FIGS. 16 and 17 show removing a portion 190 (in phantom) of first WFM 182 from NFET region 106 after forming mask 188. Portion 190 (in phantom) of first WFM 182 may be removed to allow for a second WFM for NFETs to be formed around fins 104 (e.g., fin 104c) in NFET region 106 (FIG. 16 only). FIG. 16 provides a cross-sectional view of removing portion 190 from the perspective of line A-A of FIG. 7; and FIG. 17 provides a cross-sectional view of removing portion 190 from the perspective of line B-B of FIG. 7. As shown in FIG. 16, portion 190 (in phantom) of first WFM 182 not covered by mask 188 may be removed to expose portion 194 of gate dielectric 180 surrounding fin 104c in NFET region 106. Although shown only with respect to fin 104c, it should be understood that first WFM 182 may be removed from around each fin 104 in NFET region 106, e.g., into and out of the plane of page 16. After removing portion 190 (in phantom) first WFM 182 may remain intact around fins 104a,b in PFET region 108. Additionally, first and second dielectric regions 124, 126 may prevent damage to first WFM 182 in PFET region during the removal of portion 190 (in phantom). For example, first and second dielectric regions 124, 126 may act as an etch-stop to prevent the etching of portion 190 (in phantom) from undercutting mask 188 and etching portions of first WFM 182 in PFET region 108.

Figure 18:
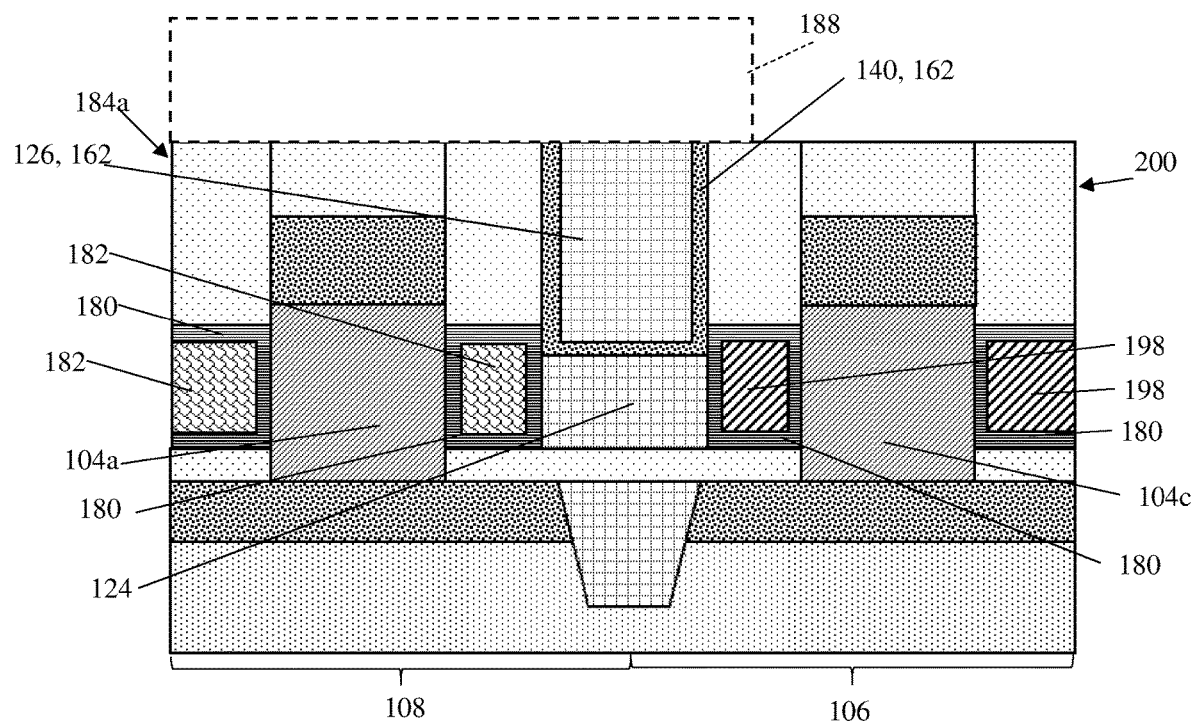

Turning next to FIGS. 17 and 18, mask 188 (in phantom) may be removed, and a second work function metal (WFM) 198 may be formed over fins 104 (e.g., fin 104c) in NFET region 106 to form NFETs 200. FIG. 17 provides a cross-sectional view from the perspective of line B-B of FIG. 7; and FIG. 18 provides a cross-sectional view from the perspective of line A-A of FIG. 7. Mask 188 (in phantom) may be removed from above PFET region 108 and remaining portion 162 of second dielectric region 126 and/or liner 140. Mask 188 (in phantom) may be removed by any suitable process such as RIE. After removing mask 188, second WFM 198 for the second RMG may be formed in both NFET region 106 and PFET region 108. As shown in FIG. 18, second WFM 198 may be formed on exposed portions 194 of gate dielectric 180 around fin 104c. Although shown only with respect to fin 104c, it is understood that WFM 198 may be formed each fin 104 in NFET region 106 into and out of the plane of FIG. 18. As shown in FIG. 17, second WFM 198 may be formed over first gate metal 182 and fins 104a,b, in PFET region 108. Second WFM 198 may include titanium carbide (TiC), titanium alumnide (TiAl), titanium aluminum carbide (TiAlC), tantalum nitride (TaN), tantalum carbide (TaC), etc. or any other desirable WFM for forming NFETs 200. Second WFM 198 may be formed by any suitable process such as deposition and planarization.

Figure 19:
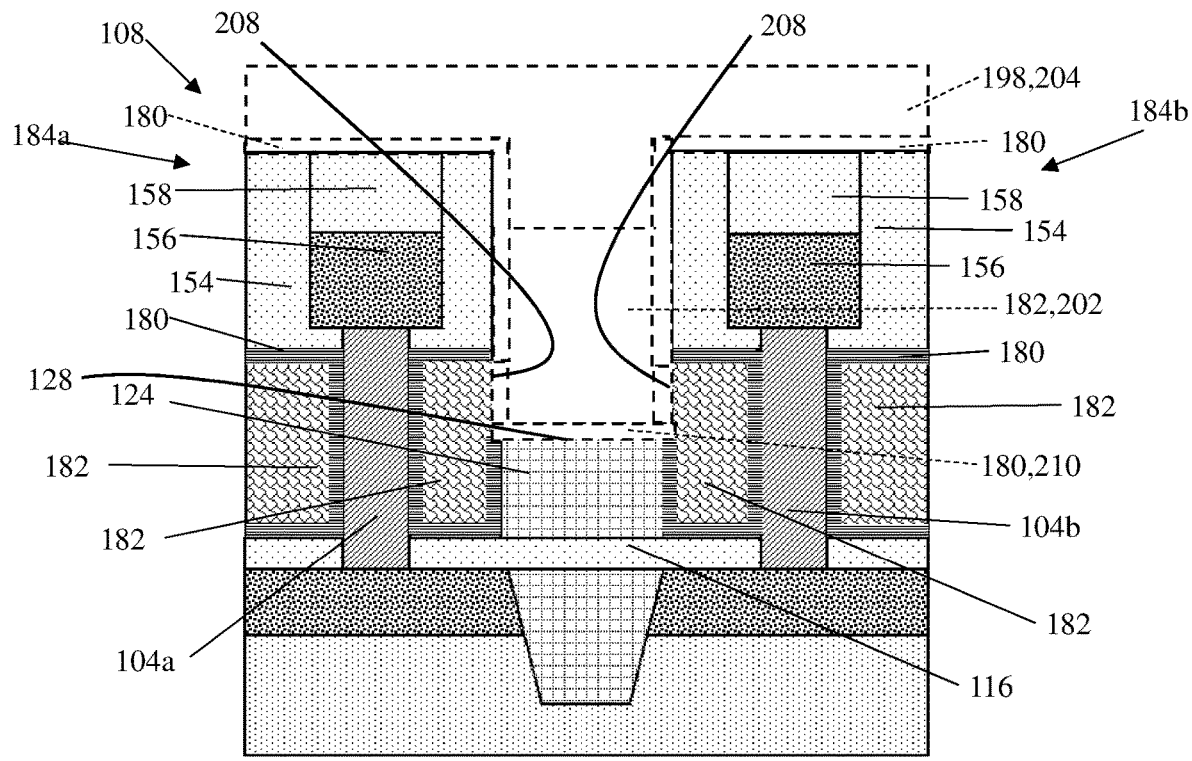
FIG. 19 shows removing a portion of the first Gate metal from between adjacent fins in the PFET region from the perspective of line B-B of FIG. 7, according to embodiments of the disclosure.

Turning next to FIG. 19, after forming second gate metal 198, portions 202,204 (in phantom) of first and second WFM 182,198 remaining between VFETs may be removed. For example, portions 202,204 may be removed to allow for a third dielectric region 218 (FIGS. 20 and 21) to be formed between and isolate adjacent VFETs. In the example of FIG. 19, portions 202,204 may be removed from above first dielectric region 124 between PFETs 184a,b in PFET region 108. Although shown only with respect to PFETs 184a,b at the cross-section along line B-B of FIG. 7, it is understood that portions of first WFM 182 and second WFM 198 may be removed from above first dielectric region 124 between each set of adjacent VFETs in region 108 and/or NFET region 106 (FIG. 7). Portions 202,204 of first and second WFM 182,198, respectively, may be removed by any suitable process such as RIE.

In contrast to conventional VFET fabrication processes, first dielectric region 124 may exist and remain between sets of adjacent VFETs where WFM would conventionally be located at this point in processing. Forming and retaining first dielectric region 124 between VFETs decreases the amount of material that is removed during subsequent processing steps. For example, in contrast to conventional processes where the region occupied by first dielectric region 124 would occupied by first RMG 182, first dielectric region 124 may remain as part of the final semiconductor structure, requiring less material to be etched. Reducing the amount of material to be removed may allow for a shorter duration etch process than in conventional processing. The processes described herein may mitigate and/or prevent damage conventionally caused to inner spacers 154, upper source/drain region 156, and/or cap 158 by the extended exposure to the etchant used to remove of the WFM.

As shown in FIG. 19, portions 208 of first WFM 182 adjacent to first dielectric region 124 may be exposed after removing portions 202, 204 of the WFMs. The process described herein may also prevent and/or mitigate damage conventionally caused to portions 208 during the removal of portions 202, 204. For example, the shorter duration etch process for removing portions 202, 204 discussed above may also prevent excess etching of portion 208 of the RMG gate structure under inner spacers 154 otherwise caused during conventional removal of the WFMs.

As also shown in FIG. 19, removing portions 202,204 of first and second WFM 182, 198, respectively, may include removing portions of gate dielectric 180 (in phantom) to expose inner spacers 154 and cap 158. Removing portions of gate dielectric 180 may also optionally include removing a portion 210 (in phantom) of gate dielectric 180 on upper surface 128 of first dielectric region 124. Removing portion 210 may allow for a subsequently formed third dielectric region to directly contact first dielectric region 124. Portion 210 of gate dielectric 180 may be removed by any suitable process such as RIE.

Figure 20:
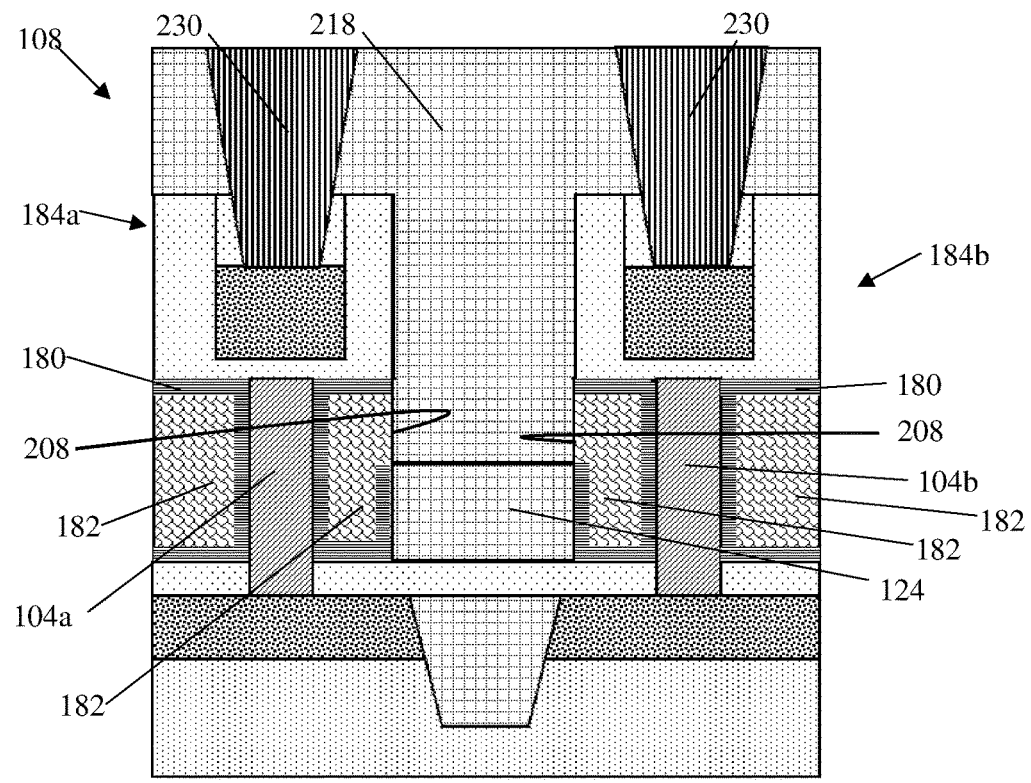
FIGS. 20 and 21 show forming a third dielectric region between adjacent fins in the PFET region from the perspective of line B-B of FIG. 7, according to embodiments of the disclosure.
Figure 21:
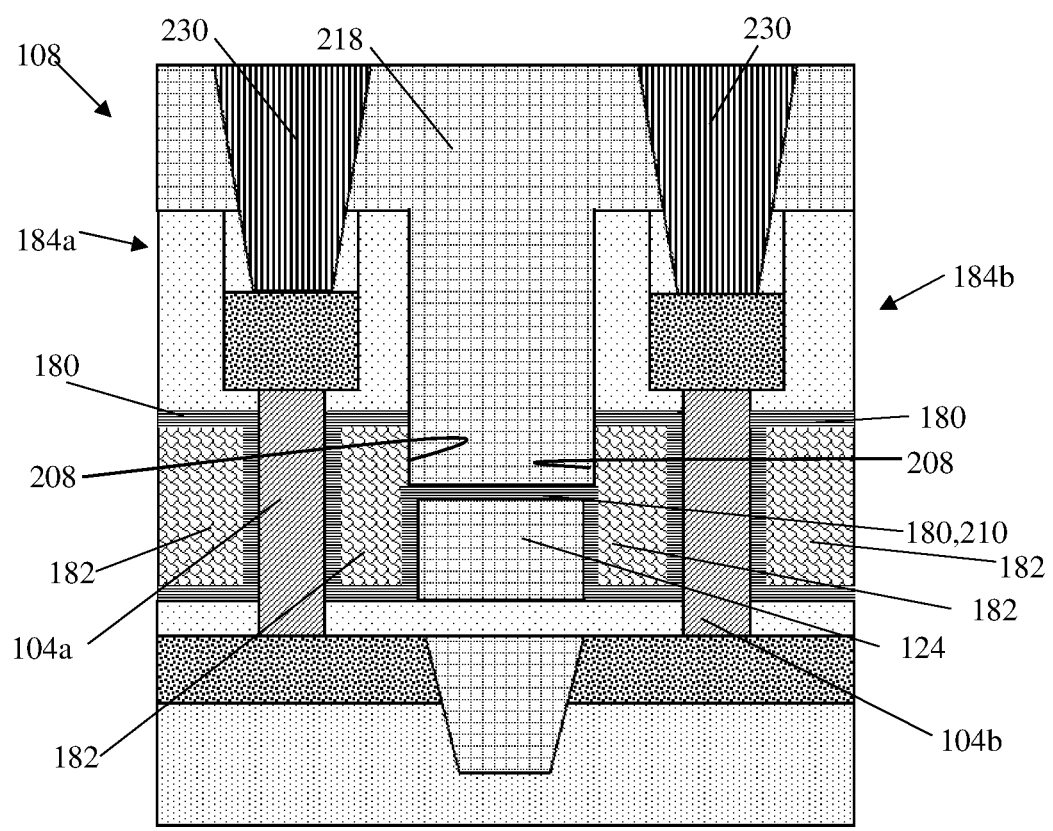

Turning next to FIGS. 20 and 21, after removing portions 202,204 of the WFMs between adjacent VFETs (e.g., PFETs 184a,b of FIG. 19), a third dielectric region 218 may be formed above first dielectric region 124. FIGS. 20 and 21 provide a cross-sectional view of PFET region 108 from the perspective of line B-B of FIG. 7. Although not shown, third dielectric region 218 may also be formed between VFETs in NFET region 106 (FIG. 7). Third dielectric region 218 may electrically isolate PFETs 184a,b from one another in PFET region 108 and NFETs 200 (FIG. 18) from one another in NFET region 106 (FIG. 7). Third dielectric region 218 may be formed by any suitable process such as deposition and planarization. Third dielectric region 218 may include the same or different material as first dielectric region 124 and/or second dielectric region 126.

As shown in the example of FIG. 20, where portion 210 (FIG. 19) of gate dielectric 180 is removed, third dielectric region 218 may directly contact first dielectric region 124. As shown in the example of FIG. 21, where portion 210 of gate dielectric 180 remains intact after removing portions 202 and 204 (in phantom, FIG. 19) of the WFMs, in contrast to conventional RMG formation, third dielectric region 218 may directly contact gate dielectric 180 such that gate dielectric 180 extends between first dielectric region 124 and third dielectric region 218. Referring to FIGS. 20 and 21 together, in contrast to conventional VFET structures, third dielectric region 218 between VFETs may also directly contact exposed portions 208 of first WFM 182 adjacent to first dielectric region 124.

After third dielectric region 218 is formed, additional processing of PFETs 184 and/or NFETs 200 (FIG. 18) may occur. For example, as also shown in FIGS. 20 and 21, contact structures 230 may be formed to PFETs 184a,b. Contact structures 230 may electrically connect PFETs 184 to other components of the semiconductor structure. Contact structures 230 may be formed by conventional processes such as, for example, etching openings, depositing a metal in the opening, and planarizing the excess metal. Although not depicted with respect to NFETs 200 (FIG. 18) in NFET region 106 (FIG. 7), it is understood that further processing of these structures may occur after the formation of third dielectric region 218. Additionally, although gate contacts structures 230 are shown, it is understood that any other desirable semiconductor structures may be formed during subsequent processing steps.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the terms "first," "second," and the like, do not denote any order, quantity, or importance, but rather are used to distinguish one element from another. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming a replacement metal gate structure for an integrated circuit, the method comprising:
   providing an initial structure including a substrate, a first fin formed over the substrate and a second fin formed over the substrate, the first and second fins being laterally separated from one another, a first lower source/drain region positioned in the substrate such that the first fin is positioned on the first lower source/drain region, and a second lower source/drain region positioned in the substrate such that the second fin is positioned on the second lower source/drain region, the first lower source/drain region being laterally separated from the second lower source/drain region;
   forming a first portion of a sacrificial material around the first fin, a second portion of the sacrificial material around the second fin, and a first dielectric region between the first and second portions of the sacrificial material, wherein an upper surface of the first portion of the sacrificial material is positioned below an upper surface of the first fin, an upper surface of the second portion of the sacrificial material is positioned below an upper surface of the second fin, and an upper surface of the first dielectric region is positioned below the upper surface of the first portion of the sacrificial material and below the upper surface of the second portion of the sacrificial material;
   forming a first extended portion of the sacrificial material around the first fin and a second extended portion of the sacrificial material around the second fin;
   forming a second dielectric region above the first dielectric region, the second dielectric region positioned between the first extended portion of the sacrificial material and the second extended portion of the sacrificial material;
   removing an upper portion of the first extended portion and second extended portions of the sacrificial material to expose the first portion and the second portion of the sacrificial material, respectively, and an upper portion of the first fin and an upper portion of the second fin, respectively;
   forming a first upper source/drain region from the exposed upper portion of the first fin and forming a second upper source/drain region from the exposed upper portion of the second fin;
   forming a first mask above a first portion of the second dielectric region between the first fin and the second fin, the first mask extending partially over the first fin adjacent to the second dielectric region and the first mask extending partially over the second fin adjacent to the second dielectric region;
   removing an exposed, second portion of the second dielectric region free from the first mask;
   removing a remaining portion of the first and second portions of the sacrificial material to expose a lower portion of the first fin, expose a lower portion of the second fin, and expose the first dielectric region; and
   forming a replacement metal gate structure around the first and second fins, including areas between the first fin and the first dielectric region and between the second fin and the first dielectric region, and on top of the first dielectric region.

2. The method of claim 1, wherein the forming of the replacement metal gate structure comprises:
   forming a gate dielectric liner on the exposed lower portion of the first fin, on the exposed lower portion of the second fin, and on the exposed first dielectric region; and
   depositing a gate metal on the gate dielectric liner and around the first and second fins to form the replacement metal gate structure.

3. The method of claim 2, further comprising, after forming the replacement metal gate structure:
   removing a portion of the replacement metal gate structure above the first dielectric region to expose an upper surface of the gate dielectric liner; and forming a third dielectric region above the first dielectric region and above the gate dielectric liner, wherein the third dielectric region contacts a portion of the replacement metal gate structure surrounding the first fin and a portion of the replacement metal gate structure surrounding the second fin, and wherein after forming the third dielectric region the gate dielectric liner is positioned between the first dielectric region and the third dielectric region.

4. The method of claim 2, further comprising, after forming the replacement metal gate structure:
  removing a portion of the replacement metal gate structure above the first dielectric region and removing a portion of the gate dielectric liner above the first dielectric region to expose an upper surface of the first dielectric region; and
  forming a third dielectric region above the first dielectric region, wherein the third dielectric region contacts a portion of the replacement metal gate structure surrounding the first fin and a portion of the replacement metal gate structure surrounding the second fin, and wherein the third dielectric region directly contacts the first dielectric region.

5. The method of claim 1, further comprising, before the forming of the first and second portions of the sacrificial material and the first dielectric region:
  forming a bottom spacer above the substrate, the bottom spacer adjacent to the first fin and adjacent to the second fin, and wherein the first and second portions of the sacrificial material are positioned on an upper surface of the bottom spacer.

6. The method of claim 1, wherein
  the initial structure further comprises a first hard mask layer on the upper surface of the first fin, and a second hard mask layer on the upper surface of the second fin; and
  the forming of the first and second portions of the sacrificial material comprises:
    depositing sacrificial material above the substrate, the sacrificial material surrounding the first fin and the first hard mask layer, and the sacrificial material surrounding the second fin and the second hard mask layer;
    removing a portion of the sacrificial material above the first hard mask layer and above the second hard mask layer; and
    removing a portion of the sacrificial material between the first fin and the second fin,
    thereby forming the first portion of the sacrificial material surrounding the first fin and the second portion of the sacrificial material surrounding the second fin.

7. An integrated circuit (IC) structure comprising:
  a substrate;
  a first fin and a second fin, the first and second fins being positioned over the substrate and laterally separated from one another;
  a first lower source/drain region and a second lower source/drain region, the first and second lower source/drain regions being positioned in the substrate and laterally separated from one another such that the first fin is located on an upper surface of the first lower source/drain region and the second fin is located on an upper surface of the second lower source/drain region;
  a second dielectric region positioned above the first dielectric region and separating an upper portion of the first gate structure from an upper portion of the second gate structure;
  a replacement metal gate structure including a first gate structure surrounding sidewalls of the first fin and a second gate structure surrounding sidewalls of the second fin; and
  a first dielectric region positioned above the substrate and separating a lower portion of the first gate structure from a lower portion of the adjacent second gate structure, wherein an upper surface of the first dielectric region is positioned below an upper surface of the first gate structure and below an upper surface of the second gate structure, and wherein the replacement metal gate structure further includes a portion positioned on top of the first dielectric region.

8. The IC structure of claim 7, wherein
  the first gate structure includes a first work function metal (WFM) and a first gate dielectric liner, the first gate dielectric liner completely encapsulating the first WFM except for an interface between the first WFM and the second dielectric region; and
  the second gate structure includes a second WFM and a second gate dielectric liner, the second gate dielectric liner completely encapsulating the second WFM except for an interface between the second WFM and the second dielectric region.

9. The IC structure of claim 7, further comprising:
  a third gate dielectric liner positioned between the first dielectric region and the second dielectric region.

10. The IC structure of claim 7, wherein the first dielectric region includes a different material than the second dielectric region.

11. The IC structure of claim 7, further comprising:
  a third lower source/drain region positioned in the substrate, the third lower source/drain region being laterally separated from the second lower source/drain region;
  a third fin positioned on an upper surface of the third lower source/drain region;
  a third gate structure surrounding sidewalls of the third fin, the third gate structure including a third WFM and a third gate dielectric liner encapsulating the third WFM; and
  a contact structure to the substrate, the contact structure positioned between the third gate structure and the second gate structure.

12. The IC structure of claim 11, wherein the second WFM includes a different material than the third WFM.

13. An integrated circuit (IC) structure comprising:
  a substrate;
  a first fin, a second fin and a third fin, the first, second and third fins being positioned over the substrate such that the first fin is laterally separated from the second fin and the third fin is laterally separated from the second fin;
  a first source/drain region, a second source/drain region and a third source/drain region, the first, second and third source/drain regions being positioned in the substrate such that the first source/drain region is laterally separated from the second source/drain region and the third source/drain region is laterally separated from the second source/drain region, and such that the first fin is located on an upper surface of the first source/drain region, the second fin is located on an upper surface of the second source/drain region and the third fin is located on an upper surface of the third source/drain region;

a second dielectric region positioned above the first dielectric region and separating an upper portion of the first gate structure from an upper portion of the second gate structure;
a contact structure to the substrate, the contact structure positioned between the third gate structure and the second gate structure;
a replacement metal gate structure including a first gate structure surrounding sidewalls of the first fin, a second gate structure surrounding sidewalls of the second fin and a third gate structure surrounding sidewalls of the third fin; and
a first dielectric region positioned above the substrate and separating a lower portion of the first gate structure from a lower portion of the adjacent second gate structure, wherein an upper surface of the first dielectric region is positioned below an upper surface of the first gate structure, below an upper surface of the second gate structure and below an upper surface of the third gate structure, and wherein the replacement metal gate structure further includes a portion positioned on top of the first dielectric region.

14. The IC structure of claim 13, wherein
the first gate structure includes a first work function metal (WFM) and a first gate dielectric liner, the first gate dielectric liner completely encapsulating the first WFM except for an interface between the first WFM and the second dielectric region;
the second gate structure includes a second WFM and a second gate dielectric liner, the second gate dielectric liner completely encapsulating the second WFM except for an interface between the second WFM and the second dielectric region; and
the third gate structure includes a third WFM and a third gate dielectric liner encapsulating the third WFM, and wherein a material of the third WFM is different from a material of the second WFM.

15. The IC structure of claim 13, further comprising:
a third gate dielectric liner positioned between the first dielectric region and the second dielectric region.

16. The IC structure of claim 13, wherein the first dielectric region includes a different material than the second dielectric region.

* * * * *